United States Patent

Gilson et al.

[15] 3,647,447

[45] Mar. 7, 1972

[54] DYED PHOTORESIST COMPOSITIONS

[72] Inventors: Richard E. Gilson; Frederick J. Rauner, both of Rochester, N.Y.

[73] Assignee: Eastman Kodak Company, Rochester, N.Y.

[22] Filed: Mar. 3, 1969

[21] Appl. No.: 803,996

[52] U.S. Cl. ................................................96/35.1, 96/115

[51] Int. Cl. ......................................G03c 5/100, G03c 1/68

[58] Field of Search ..........................96/115, 115 P, 75, 35.1

[56] References Cited

UNITED STATES PATENTS 2,690,966 10/1954 Minsk et al. .............................96/115

3,173,787 3/1965 Clement et al...........................96/115

2,732,301 1/1956 Robertson et al.........................96/115

*Primary Examiner*—Norman G. Torchin

*Assistant Examiner*—Edward C. Kimlin

*Attorney*—William H. J. Kline, James R. Frederick and Joshua G. Levitt

[57] ABSTRACT

A photosensitive coating composition is described which comprises a photoinsolubilizable polymer, such as a cinnamic acid ester of a hydroxyl-containing polymer, and a dye which is insoluble in the developer solvent and which is essentially transparent to radiation of the wavelength to which the photoinsolubilizable polymer is sensitive. The photosensitive compositions are useful in preparing highly colored photoresists without a loss in photographic speed.

9 Claims, No Drawings

DYED PHOTORESIST COMPOSITIONS

This invention relates to photosensitive coating compositions. In a particular aspect it relates to coating compositions useful for preparing colored photoresist images.

It is desirable for many uses of photosensitive resist coatings that the developed image be readily visible. Good visibility aids in the determination of extent and quality of the resist image and is convenient for layout and handling work.

Various methods of coloring photoresists are known in the art. Minsk et al. U.S. Pat. No. 2,690,966 discloses that certain of the dyes employed therein to sensitize light-sensitive polymer also color the resist composition, and that some of the dye is retained in the developed resist image. This patent is typical of disclosures in the prior art wherein dyes are added to resist compositions. However, those dyes which have been employed with photoinsolubilizable polymers suffer from one or more disadvantages. In general, they are chosen so as to be soluble in the coating solvent for the resist composition and, hence, are also soluble in the developer solvent. Thus, during development, dye leaches out of the insolubilized areas of the resist reducing the visibility of the image areas and contaminating the background areas. As a result, definition of the photoresist image is decreased.

Photoresist images have also been colored by incorporating a dye in the developer solvent for the resist. Adams U.S. Pat. No. 3,019,106 discloses typical developer solutions containing a dye for the photoresist. During development, the dye is absorbed into the insolubilized resist image. This often requires the addition of components to aid absorption and, as a result, it may be necessary to employ complicated two-phase systems.

Thus, there is a need for a simple photoresist composition which will give a colored resist image having good definition, without prolonging the exposure required to insolubilize the resist and which avoids the need for complicated developer compositions.

Accordingly, it is an object of this invention to provide a novel dyed photoresist composition.

It is a further object of this invention to provide a novel dyed photoresist composition, the dye component of which will not leach out of the resist during development.

It is still a further object of this invention to provide a novel dyed photoresist composition which does not require longer exposures than similar undyed photoresist compositions.

The above and other objects of this invention will become apparent from the further description of this invention which follows.

In accordance with the present invention, it has been found that photosensitive coating compositions which comprise a photoinsolubilizable polymer and a dye which is not soluble in the solvent used to develop the resist image and which is substantially transparent to radiation of the wavelength to which the photoinsolubilizable polymer is sensitive provides a composition which is extremely useful for preparing crisp, distinct colored photoresist images without requiring significantly more exposure than does the undyed photoresist composition.

The dyes which are employed in the photosensitive compositions of the present invention are substantially insoluble in the developer solvents commonly employed to develop photoresists. It has been found that if such a dye is insoluble in trichloroethylene it will generally be insoluble in the common developer solvents and will be useful for the purposes of this invention. Furthermore, so as not to require increased exposure, the dye should be substantially transparent to radiation which insolubilizes the photosensitive polymer. Since most photosensitive polymers are sensitive to radiation in the blue and near ultraviolet region of the spectrum, the dye should have very low absorption of radiation of between about 350 and 480 nm. Dyes which absorb less than about 15 percent of incident radiation in this region of the spectrum have been found especially useful.

Dyes which have suitable solubility and spectral absorption characteristics for use in the photosensitive coating compositions of the present invention include basic dyes such as thiazine dyes and acid dyes such as triarylmethane dyes, monoazo dyes, polyazo dyes, and azine dyes which contain sulfonic or carboxylic acid groups. Typical dyes which are useful in the present invention include Color Index Acid Blue 1 (Color Index No. 42045), Color Index Acid Blue 59 (Color Index No. 50315), Color Index Acid Blue 90 (Color Index No. 42655), Color Index Acid Green 2 (Color Index No. 18775), Color Index Acid Green 22 (Color Index No. 42170), Color Index Direct Blue 162 (Color Index No. 35770), and Color Index Basic Blue 9

The choice of the photoinsolubilizable polymer employed in the photosensitive compositions of the present invention depends upon the photographic speed required, and the properties desired in the final resist image. A wide variety of photosensitive polymers which are useful for making resist images can be employed in the present invention. A particularly preferred group of photosensitive polymers which are useful in the present invention are prepared from ethylenically unsaturated linear polymers which are obtained by esterification of hydroxyl containing polymeric materials such as, for example, cellulose, polyvinyl alcohol, etc. with a cinnamic acid halide such as cinnamic acid, o-chloro, or m-nitro cinnamic acid chlorides as described in such patents as U.S. Pat. No. 2,670,286, U.S. Pat. No. 2,725,372 and U.S. Pat. No. 2,739,892.

The term "ethylenically unsatured" is intended to include all compounds which contain the moiety:

$$>C=C<$$

such as is found in cinnamic acid derivatives. Cinnamic acid esters of polyvinyl alcohol and cellulose of varying acyl content may be prepared by deacylation of substantially fully esterified cinnamic acid esters as described in the above mentioned U.S. Pat. No. 2,670,286. Particularly useful, are the solvent-soluble esters containing from about 60 to 100 mol percent, preferably about 87 to 100 mol percent, of vinyl cinnamate units.

By the term "cinnamic acid esters of polyvinyl alcohol and cellulose" is meant organic solvent-soluble esters containing from about 60 to 100 mol percent of combined cinnamoyl ester groups. This includes simple as well as mixed esters, e.g., polyvinyl acetate cinnamates and cellulose acetate cinnamates, containing at least 60 mol percent cinnamoyl ester and the balance comprising a different acyl group, or being unesterified, or both.

A typical photosensitive composition useful for forming resist images is compounded of the following materials:

| | | |
|---|---|---|
| Polyvinyl cinnamate | 2.5 | grams |
| Solvent | 100.0 | ml. |
| Sensitizer compound | 0.25 | gram |

Solvents and solvent combinations for the coating compositions and for developing the exposed sensitive layers of the invention can be selected from those set forth in the above-mentioned U.S. Pat. No. 2,670,286.

The concentration of sensitizer compound in the coating formulation depends upon its solubility in the particular solvent used, the compatibility of the sensitizer with the photosensitive polymer and, of course, the amount of polymer present. When using polyvinyl cinnamate, from about 2 to 25 percent, and preferably 10 percent, by weight, of sensitizing compound based on the weight of polyvinyl cinnamate gives particularly useful results. With certain coating thicknesses, an amount less than 2 percent produces measurable speed increases. The concentration of polyvinyl cinnamate in the coating formulation can be varied as required by the particular conditions of coating under consideration.

The amount of dye which is added to the photosensitive coating compositions of the present invention will depend upon the particular dye which is employed, the photosensitive polymer used in the coating composition, the solvent employed as a coating solvent and other addenda which may be present in the composition. It has been found that distinct, highly colored photoresist images are obtained when the dye is present in the coating composition in amount of about 1 percent to about 10 percent, and preferably 2 percent to 5 percent, by weight, based on the weight of the photosensitive polymer contained in the composition.

The following examples further illustrate the practice of the present invention.

EXAMPLE 1

Milling Brilliant Blue 2J (CI Acid Blue 90) is insoluble in trichloroethylene. The absorption characteristics of the dye show about 100 percent transmission between 350 and 480 nm. A coating solution containing this acid dye and having the following composition is prepared:

| | |
|---|---|
| Polyvinyl cinnamate | 208.0 grams |
| 2-Benzoylmethylene-1-methyl-β-naphthothiazoline | 2.1 grams |
| Hydroquinone | 1.0 gram |
| Monochlorobenzene | 1,400.0 cc. |
| Cyclohexanone | 300.0 cc. |
| Ethylene glycol monoethyl ether | 300.0 cc. |
| Milling Brilliant Blue 2J | 2.1 grams |

This solution is whirl coated on copper plates and the plates are dried. After imagewise exposure to a 95 amp. carbon arc at a distance of 4 feet for 4 minutes, the plates are developed in a vapor degreaser using trichloroethylene. The processed plates show a robust color image, much more recognizable than the image on a control coating prepared without the blue dye. There is no difference in photographic speed between the control coating and the coating containing the dye.

EXAMPLE 2

Example 1 is repeated replacing Milling Brilliant Blue 2J with Alphazurine 2G (CI Acid BLUE 1), Kiton Fast Green V (CI Acid Green 2), Alkali Fast Green 10G (CI Acid Green 22), and Niagara Fast Copper Blue R (CI Direct Blue 162). In each case, the processed plates show a robust colored image with no difference in speed between the dyed coatings and control coatings from which dye is omitted.

EXAMPLE 3

A coating solution containing a basic dye, methylene blue (CI Basic Blue 9), is prepared having the following composition:

| | |
|---|---|
| Polyvinyl cinnamate | 10.0 g. |
| 2-Benzoylmethylene-1-methyl-β-naphthothiazoline | 1.0 g. |
| Hydroquinone | 0.3 g. |
| Cyclohexanone | 150.0 cc. |
| Ethylene glycol monoethyl ether | 150.0 cc. |
| Monochlorobenzene | 700.0 cc. |
| Methylene blue | 2.0 g. |

The formulation is whirl coated at 80 r.p.m. on grained gravure copper sheet, prebaked at 120° C. for 15 minutes and exposed as in Example 1. The plate is developed with trichloroethylene vapor and spray. The resulting image is a robust blue and the plate exhibits the same photographic speed as an undyed control coating.

EXAMPLE 4

Milling Lt Navy JL double 70 (CI Acid Blue 113) is used as in Example 1 to prepare a colored resist formulation. This dye has a relatively high absorption in the 360 nm. to 600 nm. range. After development of a copper plate coated with this formulation and exposed as in Example 1, a colored image is obtained, but the coating is about four times slower in photographic speed than the undyed resist formulation.

EXAMPLE 5

Alizarine Cyanine Green GHN (CI Acid Green 25) is soluble in trichloroethylene. Example 1 is repeated substituting this dye for Milling Brilliant Blue 2J. During development in a vapor degreaser, using trichloroethylene, the dye is removed from the image areas, resulting in an image similar to the control containing no dye.

The invention has been described in detail with particular reference to preferred embodiments thereof, but it will be understood that variations and modifications can be effected within the spirit and scope of the invention.

What is claimed is:

1. A photosensitive coating composition for use in the preparation of a photoresist image by a process which includes the step of development with an organic solvent, the composition comprising
   a. a photosensitive polymer obtained by the esterification of a hydroxyl-containing polymer with a cinnamic acid halide and
   b. a dye which is insoluble in the organic developer solvent and which is substantially transparent to radiation in the region of the spectrum to which the photosensitive polymer is sensitive, the dye being selected from the group consisting of
   Color Index Acid Blue 1,
   Color Index Acid Blue 90,
   Color Index Acid Green 22,
   Color Index Acid Green 2 and
   Color Index Direct Blue 162.

2. A composition of claim 1 wherein the photosensitive polymer is polyvinyl cinnamate.

3. A composition of claim 2 wherein the dye is Color Index Acid Blue 90.

4. A photosensitive element for use in the preparation of a photoresist image by a process which includes the step of development with an organic solvent, the element comprising a support bearing a layer of a composition comprising
   a. a photosensitive polymer obtained by the esterification of a hydroxyl-containing polymer with a cinnamic acid halide and
   b. a dye which is insoluble in the organic developer solvent and which is substantially transparent to radiation in the region of the spectrum to which the photosensitive polymer is sensitive, the dye being selected from the group consisting of
   Color Index Acid Blue 1,
   Color Index Acid Blue 90,
   Color Index Acid Green 22,
   Color Index Acid Green 2 and
   Color Index Direct Blue 162.

5. An element of claim 4 wherein the photosensitive polymer is polyvinyl cinnamate.

6. An element of claim 5 wherein the dye is Color Index Acid Blue 90.

7. A process for preparing a resist image which comprises the steps of
   1. coating on a support a layer of a photosensitive composition comprising
      a. a photosensitive polymer obtained by the esterification of a hydroxyl-containing polymer with a cinnamic acid halide and
      b. a dye which is insoluble in the organic developer solvent used to develop the resist image and which is substantially transparent to radiation in the region of the spectrum to which the photosensitive polymer is sensitive, the dye being selected from the group consisting of
      Color Index Acid Blue 1,
      Color Index Acid Blue 90,
      Color Index Acid Green 22,
      Color Index Acid Green 2 and
      Color Index Direct Blue 162, 2. imagewise exposing the layer of photosensitive composition to actinic radiation to insolubilize the exposed areas of the layer and
3. developing a resist image by removing composition from the unexposed areas of the layer with an organic solvent therefor which is a nonsolvent for composition in the exposed areas of the layer.

8. A process of claim 7 wherein the photosensitive polymer is polyvinyl cinnamate.

9. A process of claim 8 wherein the dye is Color Index Acid Blue 90.

* * * * *